United States Patent
Jia et al.

(10) Patent No.: US 10,885,881 B2
(45) Date of Patent: Jan. 5, 2021

(54) FLEXIBLE DISPLAY DEVICE WITH DEFORMATION LAYER AND CONTROL METHOD THEREFOR

(71) Applicant: BOE TECHNOLOGY GROUP CO., LTD., Beijing (CN)

(72) Inventors: Yanan Jia, Beijing (CN); Xue Dong, Beijing (CN); Haisheng Wang, Beijing (CN); Yingming Liu, Beijing (CN); Rui Xu, Beijing (CN); Changfeng Li, Beijing (CN); Yuzhen Guo, Beijing (CN); Lijun Zhao, Beijing (CN); Yanling Han, Beijing (CN); Pinchao Gu, Beijing (CN); Yunke Qin, Beijing (CN); Jing Lv, Beijing (CN); Chun Wei Wu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/327,072

(22) PCT Filed: May 7, 2018

(86) PCT No.: PCT/CN2018/085856
§ 371 (c)(1),
(2) Date: Feb. 21, 2019

(87) PCT Pub. No.: WO2018/205901
PCT Pub. Date: Nov. 15, 2018

(65) Prior Publication Data
US 2019/0213978 A1    Jul. 11, 2019

(30) Foreign Application Priority Data
May 10, 2017 (CN) .......................... 2017 1 0328669

(51) Int. Cl.
*G09G 3/30* (2006.01)
*G09G 5/38* (2006.01)
(Continued)

(52) U.S. Cl.
CPC ............ *G09G 5/38* (2013.01); *H01L 27/3232* (2013.01); *H01L 27/3244* (2013.01);
(Continued)

(58) Field of Classification Search
CPC . G09G 2380/02; B81B 3/00; G02B 26/00–10
See application file for complete search history.

(56) References Cited

U.S. PATENT DOCUMENTS

2007/0014916 A1* 1/2007 Daniels ................. B82Y 20/00
427/66
2010/0188422 A1* 7/2010 Shingai ................... G06F 3/016
345/647
(Continued)

FOREIGN PATENT DOCUMENTS

CN    104317396 A    1/2015
CN    104464620 A    3/2015
(Continued)

OTHER PUBLICATIONS

International Search Report and Written Opinion dated Jul. 16, 2018 from State Intellectual Property Office of the P.R. China.
(Continued)

*Primary Examiner* — Sanghyuk Park
(74) *Attorney, Agent, or Firm* — Dilworth & Barrese, LLP.; Michael J. Musella, Esq.

(57) ABSTRACT

Provided are a flexible display device and a control method thereof. The flexible display device includes: a base substrate; a display component located on the base substrate; a top-layer cover plate, configured to package the display component; a deformation layer, configured to create a
(Continued)

deformation to drive the flexible display device to deform; and a control element, located on the base substrate and configured to control a deformation variable of the deformation layer.

16 Claims, 7 Drawing Sheets

(51) Int. Cl.
 *H01L 27/32* (2006.01)
 *H01L 51/00* (2006.01)
 *H01L 51/52* (2006.01)
(52) U.S. Cl.
 CPC ...... *H01L 51/0097* (2013.01); *H01L 51/5281* (2013.01); *H01L 51/5284* (2013.01); *G09G 2320/068* (2013.01); *G09G 2354/00* (2013.01); *G09G 2380/02* (2013.01); *H01L 2251/5338* (2013.01)

(56) References Cited

U.S. PATENT DOCUMENTS

| | | | |
|---|---|---|---|
| 2012/0235893 | A1 | 9/2012 | Phillips et al. |
| 2014/0204509 | A1 | 7/2014 | Park |
| 2015/0177909 | A1* | 6/2015 | Hoffman ............... G06F 3/042 345/175 |
| 2015/0242056 | A1 | 8/2015 | Hoffman |
| 2016/0148554 | A1* | 5/2016 | Lim ..................... G09G 3/20 345/694 |
| 2017/0083052 | A1 | 3/2017 | Hong et al. |
| 2017/0337904 | A1 | 11/2017 | Du |
| 2017/0364120 | A1 | 12/2017 | Zhao et al. |
| 2018/0033356 | A1 | 2/2018 | Zhou et al. |
| 2019/0213978 | A1 | 7/2019 | Jia et al. |

FOREIGN PATENT DOCUMENTS

| | | |
|---|---|---|
| CN | 104537975 A | 4/2015 |
| CN | 104751773 A | 7/2015 |
| CN | 104881166 A | 9/2015 |
| CN | 105761616 A | 7/2016 |
| CN | 105761617 A | 7/2016 |
| CN | 106293014 A | 1/2017 |
| CN | 106293015 A | 1/2017 |
| CN | 106601132 A | 4/2017 |
| CN | 106910432 A | 6/2017 |

OTHER PUBLICATIONS

First Chinese Office Action dated Nov. 5, 2018.
Second Chinese Office Action dated Apr. 22, 2019.

* cited by examiner light with a specific wavelength

FLEXIBLE DISPLAY DEVICE WITH DEFORMATION LAYER AND CONTROL METHOD THEREFOR

CROSS-REFERENCE TO RELATED APPLICATION

The present application claims the priority to the Chinese Patent Application No. 201710328669.7, filed on May 10, 2017, the entire disclosure of which is incorporated herein by reference as part of the present application.

TECHNICAL FIELD

The embodiments of the present disclosure relate to a flexible display device and a control method thereof.

BACKGROUND

With the development of display technology, more and more flexible display devices are used in the fields of curved display and wearable display, etc. due to their bendable and foldable characteristics. Therefore, the flexible display devices have become hot spots in the fields of curved display and wearable display in recent years.

Generally, a flexible display screen either requires to be bent manually, which causes poor experience for users; or the flexible display screen is in fixed state or can only be maintained at a fixed curvature, which is unable to meet consumer's demand to a curved screen for viewing comfort, especially in the field of smart wear, the devices have complex and different shapes, and have rich functions, thus a simple flexible display screen cannot fully meet the requirements of various consumer groups.

SUMMARY

Embodiments of the present disclosure provide a flexible display device and a control method thereof, which can control deformation of the flexible display device.

At least one embodiment of the present disclosure provides a flexible display device, and the flexible display device includes: a base substrate, a display component on the base substrate, a top-layer cover plate configured to package the display component, a deformation layer configured to undergo deformation to drive the flexible display device to be deformed, and a control element located on the base substrate and configured to control an amount of deformation of the deformation layer.

According to the flexible display device provided by an embodiment of the present disclosure, the deformation layer is a photoinduced deformation layer.

According to the flexible display device provided by an embodiment of the present disclosure, the photoinduced deformation layer is mainly made of a liquid crystal elastomer material having a photo-responsive organic chromophore.

According to the flexible display device provided by an embodiment of the present disclosure, the control element is configured to emit light onto the deformation layer to drive the deformation layer to undergo deformation.

According to the flexible display device provided by an embodiment of the present disclosure, the display component includes a pixel light-emitting array, and the control element is disposed at a same layer as the pixel light-emitting array.

According to the flexible display device provided by an embodiment of the present disclosure, the control element is an organic light-emitting diode.

According to the flexible display device provided by an embodiment of the present disclosure, the flexible display device further includes a detector, and the detector is configured to detect a viewing position of a viewer.

According to the flexible display device provided by an embodiment of the present disclosure, the flexible display device further includes a controller, and the controller is configured to control the control element to emit light according to the viewing position of the viewer.

According to the flexible display device provided by an embodiment of the present disclosure, a projection of the deformation layer covers an entirety of the base substrate, and the control element includes a plurality of control sub-elements to control the deformation layer to undergo deformation with different amounts at different positions.

According to the flexible display device provided by an embodiment of the present disclosure, the deformation layer includes a plurality of deformation sub-portions, and the control element includes a plurality of control sub-elements, each of the deformation sub-portions is arranged corresponding to at least one of the control sub-elements.

According to the flexible display device provided by an embodiment of the present disclosure, the plurality of deformation sub-portions are arranged in a matrix.

According to the flexible display device provided by an embodiment of the present disclosure, the plurality of deformation sub-portions are strip-shaped structures arranged in parallel.

According to the flexible display device provided by an embodiment of the present disclosure, the deformation layer is located between the base substrate and the display component.

According to the flexible display device provided by an embodiment of the present disclosure, the deformation layer is located on a side of the display component facing away from the base substrate.

At least one embodiment of the present disclosure further provides a control method of any one of the flexible display devices described above, and the control method includes: initiating the flexible display device; and switching on the control element to deform the deformation layer to drive the flexible display device to be deformed.

According to the control method of the flexible display device provided by an embodiment of the present disclosure, the flexible display device includes a detector and a controller, switching on the control element to allow the deformation layer to undergo deformation to drive the flexible display device to be deformed includes: detecting, by the detector, a viewing position of a viewer; and controlling the control element to emit light to allow the deformation layer to undergo deformation to drive the flexible display device to be deformed, by the controller, according to the viewing position of the viewer.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. Also, the terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of the object which is described is changed, the relative position relationship may be changed accordingly.

Figure 1A:
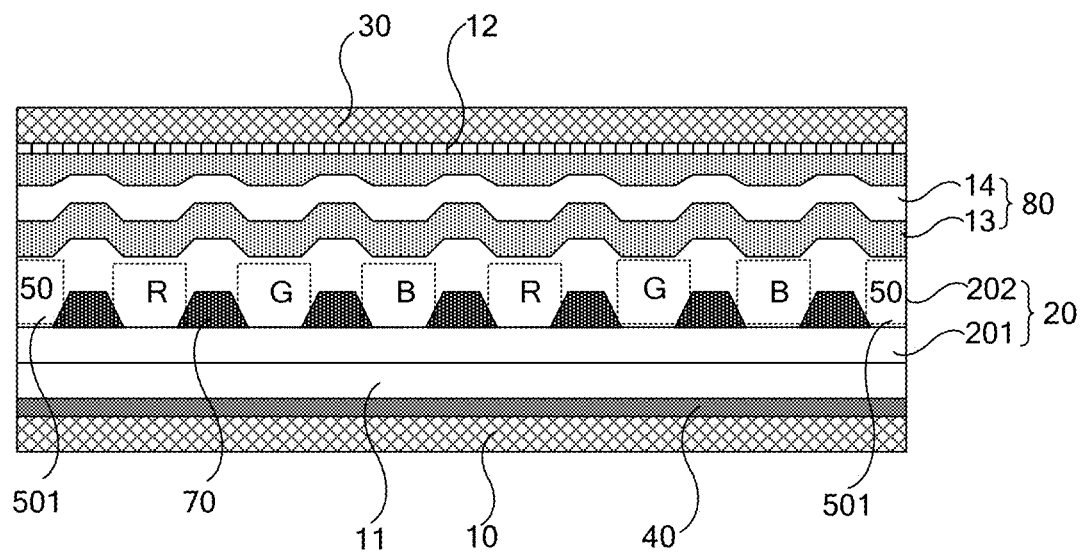
FIG. 1A is a schematic view of a structure of a flexible display device provided by an embodiment of the present disclosure.

An embodiment of the present disclosure provides a flexible display device, as illustrated in FIG. 1A, the flexible display device includes: a base substrate 10, a display component 20 located on the base substrate 10, and a top-layer cover plate 30 configured to package the display component 20. Those skilled in the art should understand that as a flexible display device, each layer in the flexible display device may be bendable in a certain extent.

As illustrated in FIG. 1A, the display component 20 generally includes a thin film transistor (TFT) array (TFT array) 201, and a pixel definition layer 70 and a pixel light-emitting array 202 which are disposed on the TFT array 201. For example, the pixel light-emitting array 202 may be an organic light-emitting diode (OLED) array. The embodiments of the present disclosure are further described with reference to the case where the pixel light-emitting array 202 is OLED light-emitting array, by way of example.

As illustrated in FIG. 1A, the flexible display device further includes: a deformation layer 40, and a control element 50 which is disposed on the base substrate 10. For example, the deformation layer 40 is a photoinduced deformation layer, and the photoinduced deformation layer has different deformation amounts under different intensities of illumination. For example, when the deformation layer 40 is deformed, the flexible display device is driven to undergo deformation. The control element 50 is configured to emit light onto the photoinduced deformation layer to drive the photoinduced deformation layer to undergo deformation. For example, the control element 50 includes a plurality of control sub-elements 501. Of course, the control element 50 may also include only one control sub-element 501.

Figure 1B:
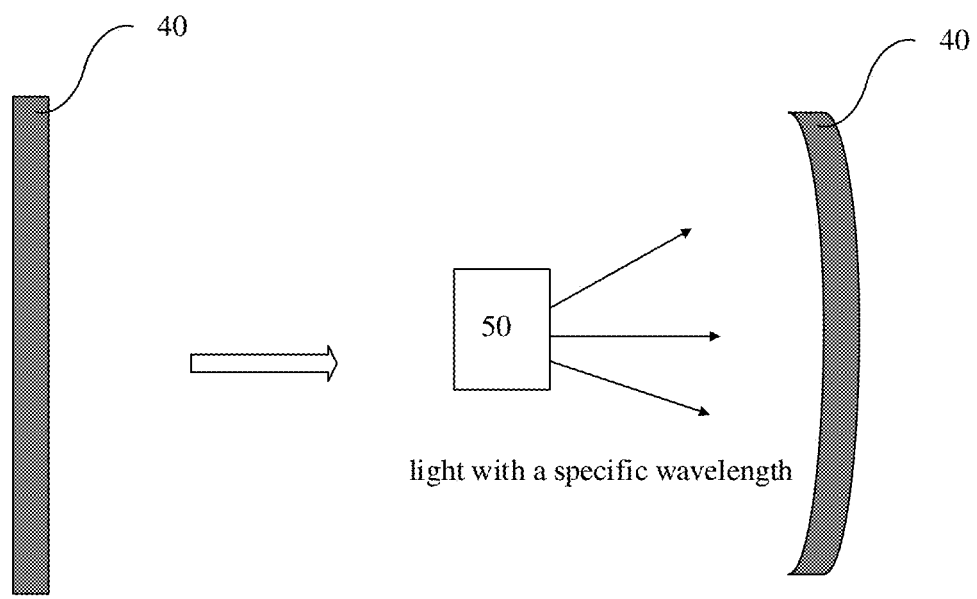
FIG. 1B is a schematic diagram of deformation of a photoinduced deformation layer provided by an embodiment of the present disclosure caused by light irradiated thereon.

For example, as illustrated in FIG. 1B, taking the deformation layer 40 having a planar layer structure in an initial state as an example, when light with a specific wavelength is not irradiated onto the deformation layer, referring to a part of FIG. 1B located on left side of the hollow arrow, the deformation layer 40 maintains the planar layer structure in the initial state. When light with a specific wavelength emitted from the control element 50 is incident onto the deformation layer 40, referring to a part of FIG. 1B located on right side of the hollow arrow, the deformation layer 40 is deformed into a curved structure. For example, when the light with the specific wavelength is switched off, the deformation layer 40 would return to the planar layer structure of the initial state.

For example, the light emitted from the control element 50 is ultraviolet light, infrared light, or visible light. In this case, the deformation layer 40 is made of a photodeformable material capable of being deformed by irradiation of light with a specific wavelength. For example, in a case that the light emitted from the control element 50 is infrared light, the deformation layer 40 is made of a photodeformable material that can be deformed under irradiation of infrared light. For example, in a case that the light emitted from the control element 50 is infrared light, the deformation layer 40 is made of a photodeformable material that can be deformed under irradiation of infrared light.

For example, the photoinduced deformation layer is mainly made of a liquid crystal elastomer material having a photo-responsive organic chromophore. For example, the photo-responsive organic chromophore is azobenzene, benzospiropyran, 1,2-stilbene, etc., which is not limited in the embodiment of the present disclosure. Taking the azobenzene-based substance as an example, in a case that the photoinduced deformation layer is made of the liquid crystal elastomer material with azodiphenylacetylene side group, under the irradiation of ultraviolet light, the azodiphenylacetylene side group would absorb light energy to undergo cis-trans isomerization, causing the arrangement of basic elements of the liquid crystal elastomer material to be changed, so that the deformation layer is bent and deformed macroscopically.

For example, in an embodiment of the present disclosure, the control element is integrated on the base substrate of the flexible display device, and the deformation layer is also located in the flexible display device, so that the control element can be controlled to emit light to a specific position of the photoinduced deformation layer in an intelligent manner to achieve a deformation control in the specific position of the deformation layer. That is, the embodiment of the present disclosure provides an integrated flexible display device that can be intelligently controlled on bending to meet user's multi-directional requirements and improve user's experience.

For example, in an embodiment of the present disclosure, the deformation amount of the deformation layer can be adjusted by adjusting the intensity of light emitted from the control element to obtain the flexible display device having a desired shape. For example, the greater the intensity of the light emitted from the control element, the larger the deformation amount of the deformation layer.

For example, the deformation amount of the deformation layer can be adjusted by controlling the control element from a center to opposite sides in the flexible display device to emit light with different intensities, to obtain a flexible display device having a desired shape, such as a curved flexible display device.

Figure 2:
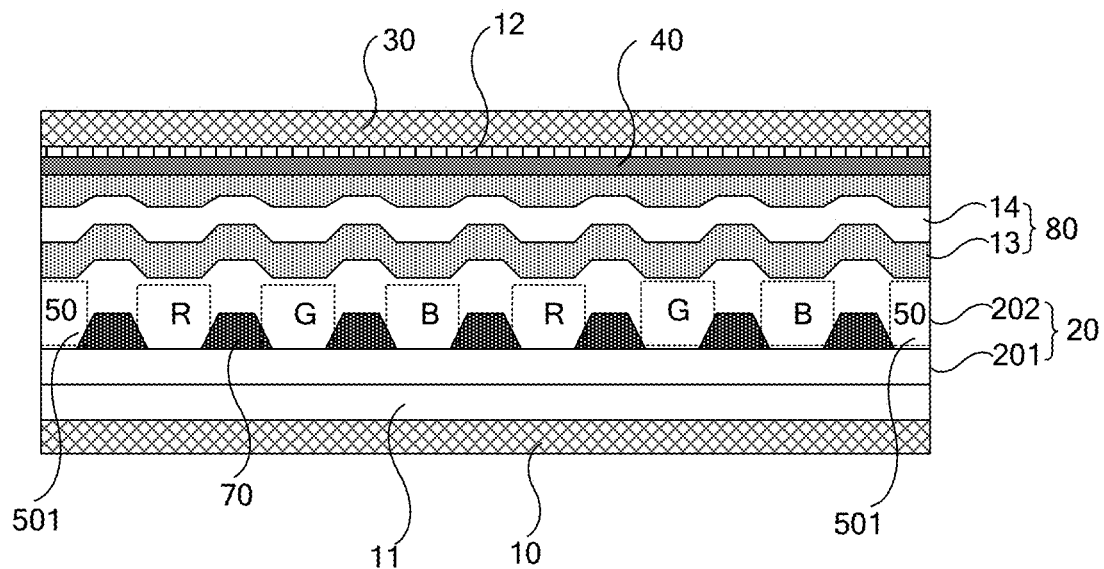
FIG. 2 is another schematic view of a structure of a flexible display device provided by an embodiment of the present disclosure.

For example, as illustrated in FIG. 1A and FIG. 2, in general, in the flexible display device, a flexible substrate 11 is disposed between the TFT array 201 and the base substrate 10. For example, a material of the flexible substrate 11 is polyimide (PI). For example, a thin film encapsulation layer 80 is disposed on a side of the pixel light-emitting array 202 facing away from the base substrate 10. For example, the thin film encapsulation layer 80 includes a water blocking layer 13 and a planarization layer 14. Of course, in order to obtain better water and oxygen barrier property, a plurality of water blocking layers 13 and/or a plurality of planarization layers 14 may be provided.

For example, a polarizer 12 is disposed on a side of the top-layer cover plate 30 close to the base substrate 10 to prevent external light from causing interference to the flexible display device and affecting the display effect.

For example, in order to avoid an increase in thickness of the flexible display device due to the control element 50 disposed on the base substrate 10, as illustrated in FIG. 1A and FIG. 2, the control element 50 is disposed at a same layer as the pixel light-emitting array 202 in the display component 20.

It should be understood by those skilled in the art that, in a case that the control element 50 is disposed at the same layer as the pixel light-emitting array 202 in the display component 20, the control element 50 is the same as an OLED light-emitting device in the pixel light-emitting array 202, that is, adopts a light-emitting structure of an organic light-emitting diode (OLED). That is, the control element takes a form that a plurality of functional layers disposed between a cathode and an anode. Of course, the light-emitting function layers in the control element 50 can be selected according to actual requirements. For example, the control element 50 can also be controlled to emit light by the TFTs in the TFT array.

For example, the control element 50 is disposed at an edge of a display region of the flexible display device or disposed at middle of the display region. For example, the control element 50 is disposed between adjacent sub-pixels, which is not limited by the embodiment of the present disclosure, as long as the control element 50 does not affect the pixel light-emitting array 202 and does not affect a normal display of the flexible display device.

Figure 3:
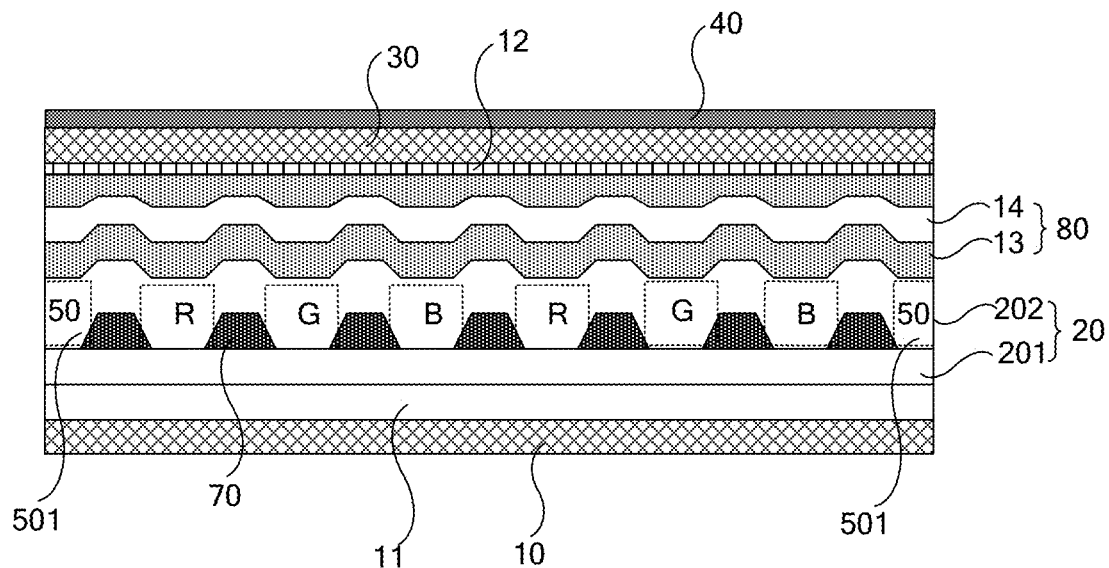
FIG. 3 is still another schematic view of a structure of a flexible display device provided by an embodiment of the present disclosure.
Figure 4A:
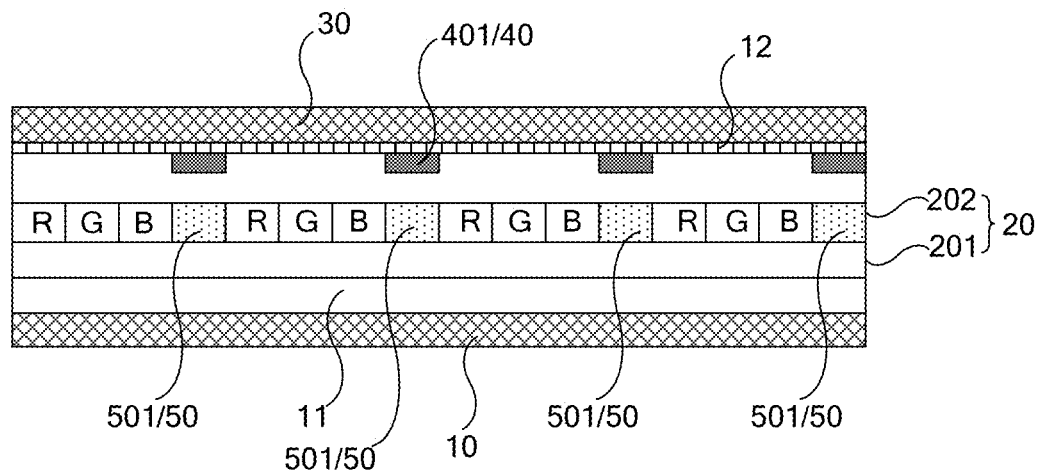
FIG. 4A is still another schematic view of a structure of a flexible display device provided by an embodiment of the present disclosure.

For example, as illustrated in FIG. 3, the deformation layer 40 is attached to a side of the top-layer cover plate 30 facing away from the base substrate 10; or the deformation layer 40 is attached to a side of the top-layer cover plate 30 close to the pixel light-emitting array 202 (as illustrated in FIG. 4A). For example, the deformation layer 40 is attached between the thin film encapsulation layer 80 and the polarizer 12 (as illustrated in FIG. 2). For example, the deformation layer 40 is irradiated by light emitted from the control element 50 which is integrated on the base substrate 10 (that is, integrated in the array substrate) to control the deformation of the deformation layer 40.

Of course, in order to improve an integration degree of the flexible display device, as illustrated in FIG. 1A, the deformation layer 40 may be disposed on the base substrate 10.

For example, disposing the deformation layer 40 on the base substrate 10 means that the deformation layer 40 is supported by the base substrate 10. For example, the deformation layer 40 is supported by the base substrate 10 at any positions thereof.

For example, in the case that the deformation layer 40 is disposed on the base substrate 10, in order to reduce the influence of the deformation layer 40 on the pixel light-emitting array 202 of the flexible display device as much as possible, as illustrated in FIG. 1A, the deformation layer 40 is disposed between the base substrate 10 and the display component 20. In this case, in a case that the flexible display device is a top emission display device, the transparency of the deformation layer 40 is not limited. In a case that the flexible display device is a bottom emission display device, the deformation layer 40 is made of a transparent material. For example, as illustrated in FIG. 2, the deformation layer 40 is disposed on a side of the display component 20 facing away from the base substrate 10. For example, as illustrated in FIG. 2, the deformation layer 40 is disposed between the thin film encapsulation layer 80 and the polarizer 12.

In this case, in a case that the flexible display device is the bottom emission display device, the transparency of the deformation layer 40 is not limited. In a case that the flexible display device is the top emission display device, the deformation layer 40 is made of a transparent material.

Figure 4B:
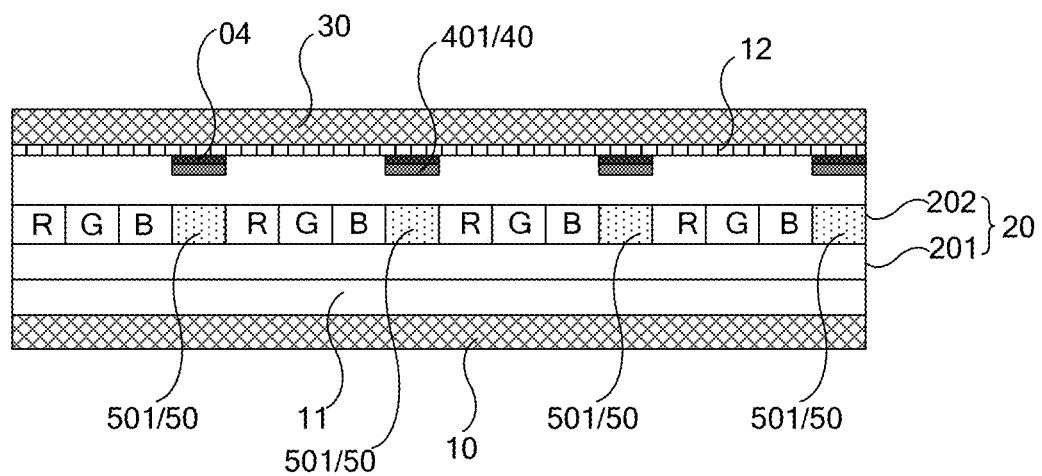
FIG. 4B is still another schematic view of a structure of a flexible display device provided by an embodiment of the present disclosure.

For example, as illustrated in FIG. 4B, in a case that the deformation layer 40 is disposed on a light-emitting side of the pixel light-emitting array 202, in order to avoid unnecessary deformation of the deformation layer 40 caused by external ambient light, a light shielding layer 04 is disposed on a side of the deformation layer 40 close to external environment. For example, the light shielding layer is a black matrix (BM). For example, as illustrated in FIG. 4B, a pattern of the light shielding layer 04 is the same as a pattern of the deformation layer 40. For example, an orthographic projection of the light shielding layer 04 on the flexible substrate 11 overlaps an orthographic projection of the deformation layer 40 on the flexible substrate 11.

The specific arrangement of the deformation layer 40 and the control element 50 is further described as follows.

For example, the orthographic projection of the deformation layer 40 covers an entirety of the base substrate 10, that is, the deformation layer 40 covers an entirety of display screen of the display device. In this case, the flexible display device includes a plurality of control sub-elements 501 corresponding to the deformation layer 40 to realize that light is emitted from different control sub-elements 501 to control the deformation layer 40 to be deformed at different positions, so as to drive the flexible display device to be deformed. For example, the deformation layer 40 is deformed with different deformation amounts at different positions to facilitate the formation of a desired structure of the display screen, for example, to facilitate the formation of a curved display screen. For example, a plurality of control sub-elements 501 are evenly distributed in the pixel light-emitting array 202, so that the display screen can be deformed at any positions corresponding to the plurality of control sub-elements 501. For example, each of the control sub-elements 501 is an organic light-emitting diode, which is not limited herein.

Figure 5:
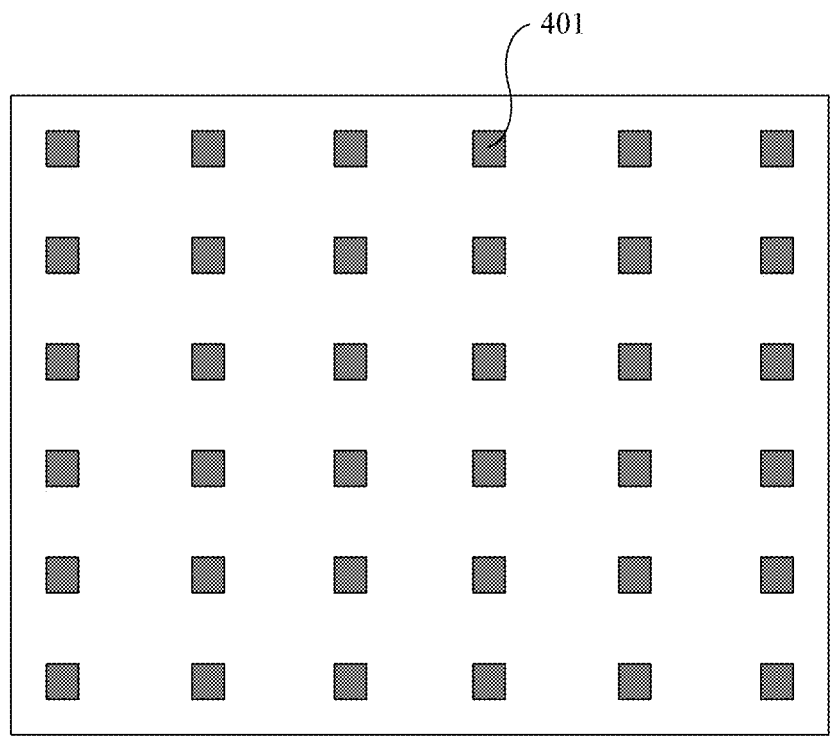
FIG. 5 is a schematic view of distribution of a deformation layer provided by an embodiment of the present disclosure.

For another example, as illustrated in FIG. 5, the deformation layer 40 includes a plurality of deformation sub-portions 401, the plurality of deformation sub-portions 401 are arranged in a matrix, and each of the deformation sub-portions corresponds to at least one of the control sub-elements 501 (as illustrated in FIG. 4A). In this case, the deformation layer 40 is controlled to be deformed at different positions by light emitted from different control sub-elements 501, so as to drive the flexible display device to be deformed at different positions. For example, as illustrated in FIG. 4A, orthographic projections of the deformation sub-portions 401 on the base substrate 10 overlap orthographic projections of the control sub-elements 501 on the base substrate 10. It should be noted that, the arrangement of the deformation sub-portions 401 and the control sub-elements 501 is not limited to this.

Figure 6:
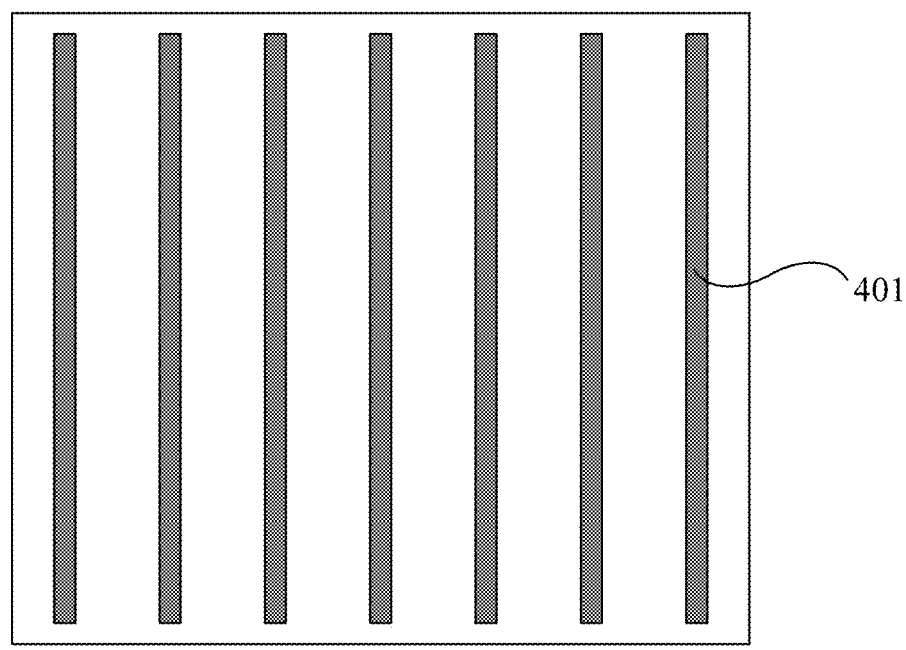
FIG. 6 is another schematic view of distribution of a deformation layer provided by an embodiment of the present disclosure.
Figure 7A:
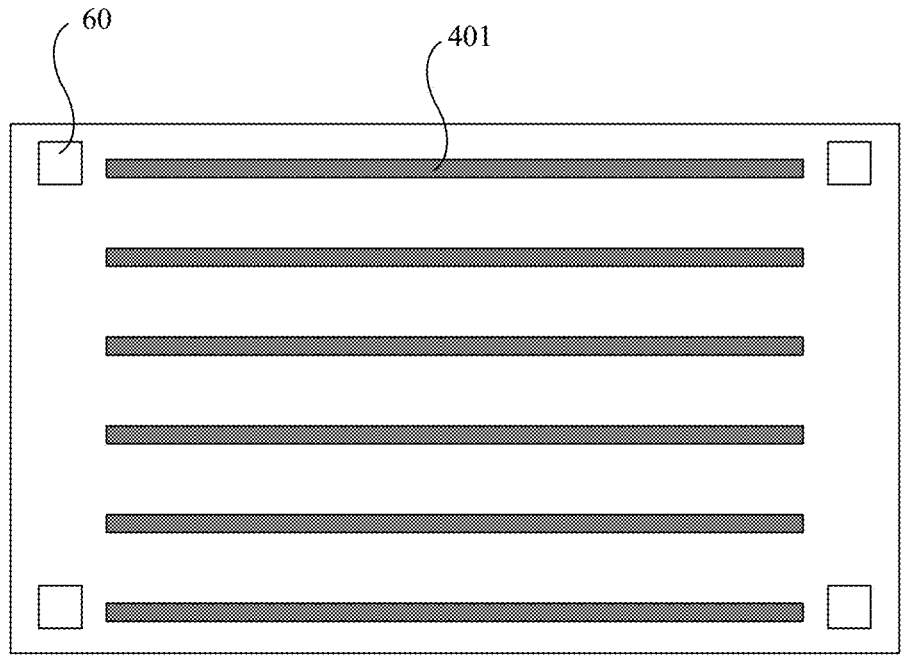
FIG. 7A is still another schematic view of distribution of a deformation layer provided by an embodiment of the present disclosure.
Figure 7B:
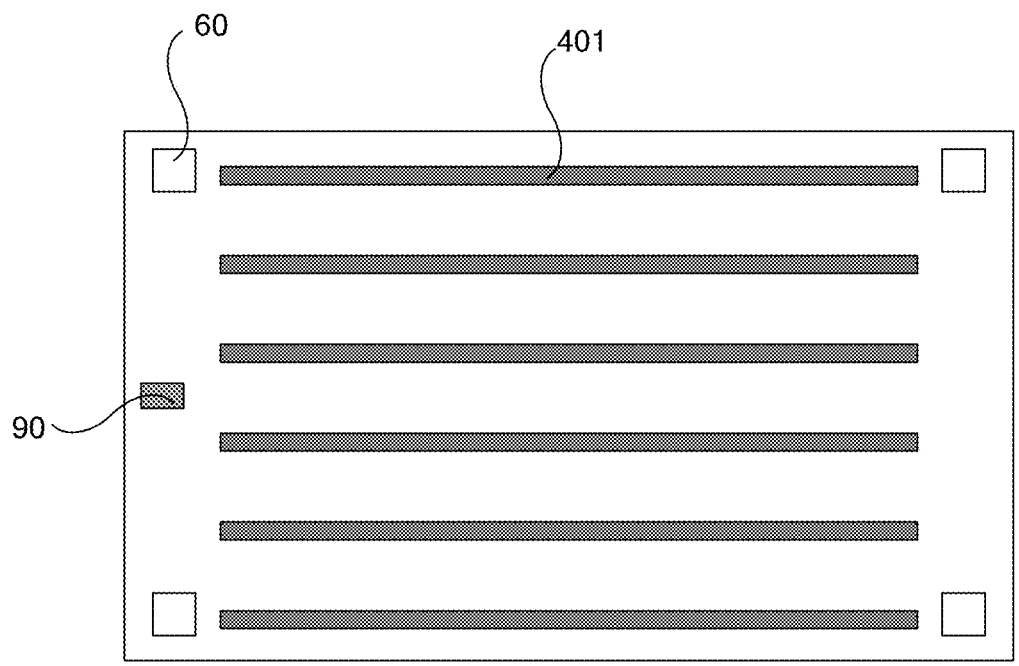
FIG. 7B is a schematic view of a controller in a flexible display device provided by an embodiment of the present disclosure.

For another example, as illustrated in FIG. 6, FIG. 7A and FIG. 7B, the deformation layer 40 includes a plurality of deformation sub-portions 401, the plurality of deformation sub-portions 401 are strip-shaped structures arranged in parallel, and each of the deformation sub-portions 401 is arranged corresponding to at least one of the control sub-elements 501. In this case, the deformation layer 40 is controlled to be deformed at different positions by light emitted from different control sub-elements 501, so as to drive the flexible display device undergo deformation at different positions.

For example, in order to further improve the intelligence of the flexible display device, as illustrated in FIG. 7A, the flexible display device further includes a detector 60, and the detector 60 is configured to detect a viewing position of a viewer.

For example, as illustrated in FIG. 7B, the flexible display device further includes a controller 90. For example, the controller 90 is connected to the control element 50. For example, the controller 90 is configured to control the control element 50 to emit light according to the viewing position of the viewer. For example, the controller 90 is configured to control the control sub-elements 501 at different positions to emit light with different intensities.

Figure 7C:
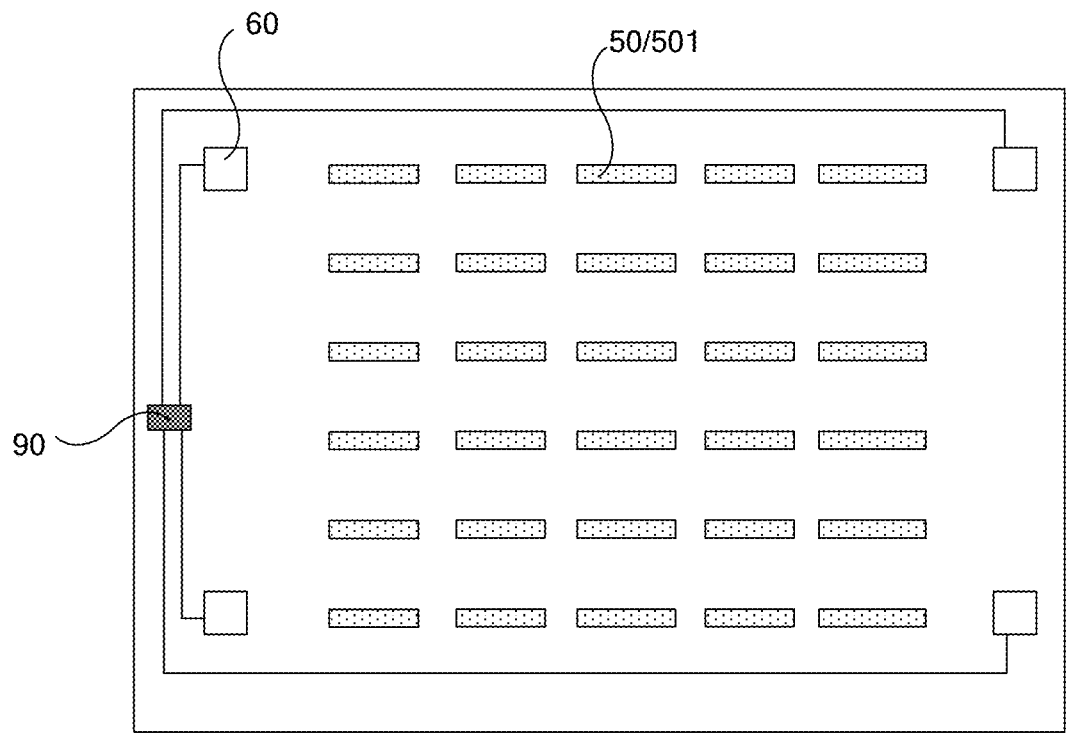
FIG. 7C is a schematic view of distribution of control sub-elements in a flexible display device provided by an embodiment of the present disclosure.

For example, as illustrated in FIG. 7C, in the flexible display device, the detector 60 is connected to the controller 90. For example, the controller 90 is connected to each of the control sub-elements 501 by thin film transistors arranged in an array (not illustrated in FIG. 7C). The detector 60 is configured to transmit the detected viewing position information of the viewer to the controller 90, and the controller 90 is configured transmit a control signal to the control sub-elements 501 according to the viewing position information of the viewer to control the intensity of the light emitted from each of the control elements 50.

FIG. 7C illustrates that the control element 50 include a plurality of control sub-elements 501 arranged in an array.

Figure 8:
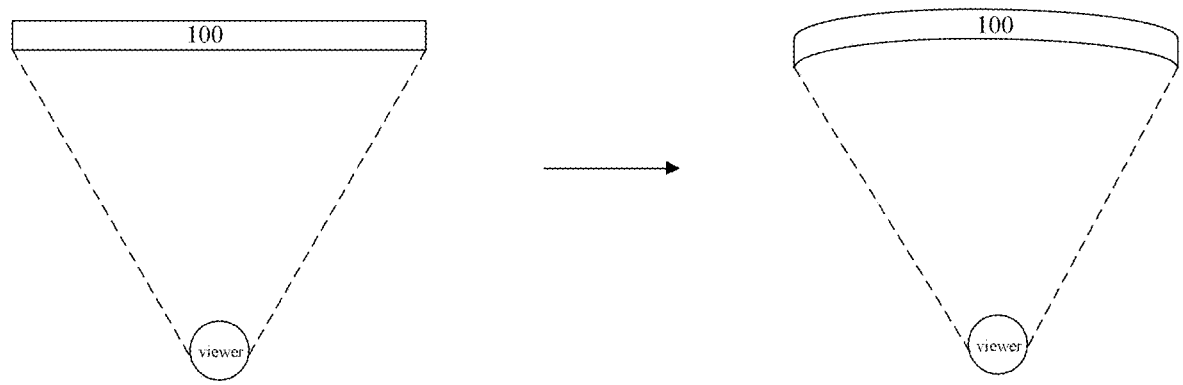
FIG. 8 is a schematic view of deformation of a flexible display device provided by an embodiment of the present disclosure according to a viewing position.

Taking a curved display device as an example, when the viewer is at different positions, the flexible display device requires to be arranged with different curvatures to satisfy the viewers' best comfortable viewing. For example, as illustrated in a part of FIG. 8B located on the left side, an initial state of a display panel 100 in the flexible display device is in a planar state, when a viewing position is detected by the detector 60, the control sub-element 501 in the corresponding position of the flexible display device is controlled by the controller to emit light according to the obtained viewing position, so as to allow the flexible display device to achieve a required curvature, as illustrated in a part of FIG. 8B located on the right side.

Figure 9:
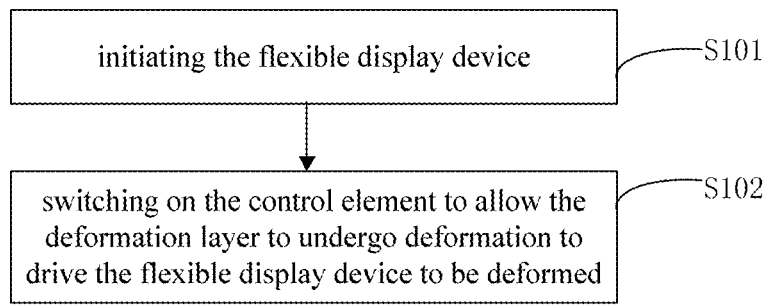
FIG. 9 is a control method of a flexible display device provided by an embodiment of the present disclosure.

At least one embodiment of the present disclosure further provides a control method of any one of the flexible display devices described above, as illustrated in FIG. 9, the control method includes:

Step S101: initiating the flexible display device.

For example, initiating the flexible display device means that at least the control element 50 is activated, and the flexible display device is either in a state that an image is displayed, or in a state that no image is displayed.

Step S102: switching on the control element 50 to allow the deformation layer 40 to undergo deformation to drive the flexible display device to be deformed.

For example, in one or more embodiments, the control element is integrated on the base substrate of the flexible display device, and the deformation layer is also located in the flexible display device, so that the control element can be controlled to emit light to specific positions of the photoinduced deformation layer in an intelligent manner to achieve a control on deformation in the specific positions of the deformation layer. That is, at least one embodiment of the present disclosure provides an integrated flexible display device that can be intelligently controlled on bending to meet user's multi-directional requirements and improve user's experience.

Figure 10:
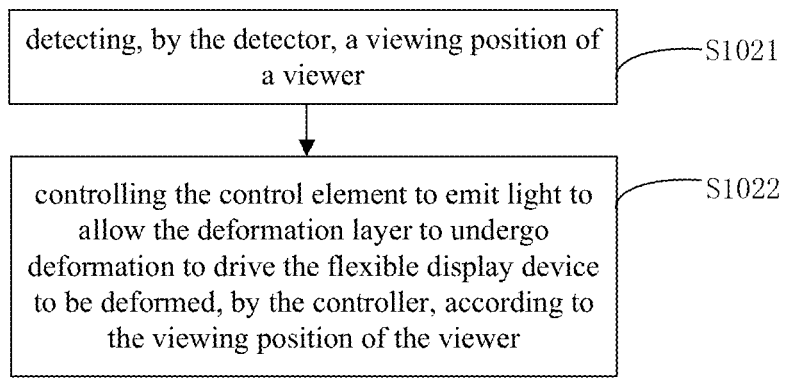
FIG. 10 is another control method of a flexible display device provided by an embodiment of the present disclosure.

For example, in a case that the flexible display device includes a detector and a controller, as illustrated in FIG. 10, the step S102 further includes:

Step S1021: detecting, by the detector 60, a viewing position of a viewer.

For example, the detector 60 is an ultrasonic detector, a radar detector, or a camera to convert the position detection information of the viewer into a circuit signal.

Step S1022: controlling the control element to emit light to allow the deformation layer to undergo deformation to drive the flexible display device to be deformed, by the controller, according to the viewing position of the viewer.

For example, the controller 90 is connected to the detector 60, according to the viewing position of the viewer detected by the detector 60, the controller 90 is configured to control the control sub-element 501 in a corresponding position to emit light to allow the deformation layer 40 to undergo deformation so as to drive the flexible display device to be deformed.

For example, while the controller controls the control sub-element 501 at a position to emit light, the controller can further control an intensity of the light emitted from the control sub-element 501 at the position, to achieve an accurate control on deformation of the flexible display device.

The flexible display device in the embodiments of the present disclosure may further include one or more processors and one or more memories. The processor may process data signals and includes various computing architectures such as a complex instruction set computer (CISC) architecture, a reduced instruction set computer (RISC) architecture, or an architecture for implementing a combination of multiple instruction sets. The memory may store instructions and/or data executed by the processor. The instructions and/or data may include codes which are configured to achieve some functions or all the functions of one or more devices described in the embodiments of the present disclosure. For example, the memory includes a dynamic random access memory (DRAM), a static random access memory (SRAM), a flash memory, an optical memory, or other memories well known to those skilled in the art.

In some embodiments of the present disclosure, the controller includes codes and programs stored in the memories; the processors may execute the codes and the programs to achieve some functions or all the functions of the controller as described above.

In some embodiments of the present disclosure, the controller may be a specialized hardware device and configured to achieve some or all the functions of the controller as described above. For example, the controller is a circuit board or a combination of a plurality of circuit boards and configured to achieve the functions described above. In embodiments of the present disclosure, the circuit board or the combination of the plurality of circuit boards includes: (1) one or more processors; (2) one or more non-transitory computer-readable memories connected with the processor; and (3) processor-executable firmware stored in memories.

It should be noted that, for the purpose of clarity only, in accompanying drawings for illustrating the embodiment(s) of the present disclosure, the thickness and size of a layer or a structure may be enlarged. However, it should be understood that, in the case in which a component or element such as a layer, film, area, substrate or the like is referred to be "on" or "under" another component or element, it may be directly on or under the another component or element or a component or element is interposed therebetween.

Furthermore, the embodiments of the present disclosure and the features therein can be combined with each other in the absence of conflict.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A flexible display device, comprising:
a base substrate;
a display component on the base substrate;
a top-layer cover plate configured to package the display component;
a deformation layer configured to undergo deformation to drive the flexible display device to be deformed; and
a control element located on the base substrate and configured to control an amount of deformation of the deformation layer,
wherein the flexible display device further comprises a flexible substrate, and the deformation layer, the flexible substrate, and the display component are disposed on the base substrate in sequence.

2. The flexible display device according to claim 1, wherein the deformation layer is a photoinduced deformation layer.

3. The flexible display device according to claim 2, wherein the photoinduced deformation layer is mainly made of a liquid crystal elastomer material having a photoresponsive organic chromophore.

4. The flexible display device according to claim 2, wherein the control element is configured to emit light onto the deformation layer to drive the deformation layer to undergo deformation.

5. The flexible display device according to claim 1, wherein the control element is an organic light-emitting diode.

6. The flexible display device according to claim 1, further comprising a detector, wherein the detector is configured to detect a viewing position of a viewer.

7. The flexible display device according to claim 6, further comprising a controller, wherein the controller is configured to control the control element to emit light according to the viewing position of the viewer.

8. The flexible display device according to claim 1, wherein an orthographic projection of the deformation layer covers an entirety of the base substrate, and the control element comprises a plurality of control sub-elements to control the deformation layer to undergo deformation with different amounts at different positions.

9. The flexible display device according to claim 8, wherein one of the plurality of control sub-elements is located between adjacent sub-pixels.

10. The flexible display device according to claim 1, wherein the deformation layer comprises a plurality of deformation sub-portions, and the control element comprises a plurality of control sub-elements, each of the deformation sub-portions is arranged corresponding to at least one of the control sub-elements.

11. The flexible display device according to claim 10, wherein the plurality of deformation sub-portions are arranged in a matrix.

12. The flexible display device according to claim 10, wherein the plurality of deformation sub-portions are strip-shaped structures arranged in parallel.

13. The flexible display device according to claim 10, further comprising a light shielding layer disposed on a side of the deformation layer and configured to prevent the deformation layer from being irradiated by external light, wherein a pattern of the light shielding layer is the same as a pattern of the deformation layer.

14. The flexible display device according to claim 1, wherein the deformation layer is located between the base substrate and the display component.

15. The flexible display device according to claim 1, wherein the deformation layer comprises a plurality of deformation sub-portions, the control element comprises a plurality of control sub-elements to control the deformation layer to undergo deformation with different amounts at different positions, each of the deformation sub-portions is arranged corresponding to at least one of the control sub-elements, orthographic projections of the plurality of deformation sub-portions overlap orthographic projections of the plurality of control sub-elements.

16. A flexible display device, comprising: a base substrate; a display component on the base substrate; a top-layer cover plate configured to package the display component; a deformation layer configured to undergo deformation to drive the flexible display device to be deformed; and a control element located on the base substrate and configured to control an amount of deformation of the deformation layer, wherein the display component comprises a pixel light-emitting array, and the control element is disposed at a same layer as the pixel light-emitting array.

* * * * *